United States Patent
Kratzer

(10) Patent No.: US 10,773,594 B2
(45) Date of Patent: Sep. 15, 2020

(54) TRACTION ENERGY STORAGE SYSTEM WITH DETERMINATION OF OPERATING LIMITS

(71) Applicant: MAN Truck & Bus AG, Munich (DE)

(72) Inventor: Sebastian Kratzer, Munich (DE)

(73) Assignee: MAN TRUCK & BUS AG, Munich (DE)

( * ) Notice: Subject to any disclaimer, the term of this patent is extended or adjusted under 35 U.S.C. 154(b) by 400 days.

(21) Appl. No.: 15/816,476

(22) Filed: Nov. 17, 2017

(65) Prior Publication Data
US 2018/0134160 A1    May 17, 2018

(30) Foreign Application Priority Data

Nov. 17, 2016   (DE) .................. 10 2016 013 702

(51) Int. Cl.
*H02J 7/00*     (2006.01)
*B60L 3/00*     (2019.01)
(Continued)

(52) U.S. Cl.
CPC .............. *B60L 3/0046* (2013.01); *B60K 1/04* (2013.01); *B60L 3/04* (2013.01); *B60L 3/12* (2013.01);
(Continued)

(58) Field of Classification Search
USPC .................................................. 320/116–118
See application file for complete search history.

(56) References Cited

U.S. PATENT DOCUMENTS 8,143,851 B2 * 3/2012 Greening ............... G06F 1/189
320/116
8,531,160 B2 * 9/2013 Moorhead ............. H02J 7/0029
320/136
(Continued)

FOREIGN PATENT DOCUMENTS

DE     102007038532 A1    2/2009
DE     102010002939 A1    9/2011
(Continued)

OTHER PUBLICATIONS

European Notice of Allowance issued in European Patent Application No. 17199702.6 dated Feb. 14, 2020, 5 pages. No English translation available.

*Primary Examiner* — Samuel Berhanu
(74) *Attorney, Agent, or Firm* — Weber Rosselli & Cannon LLP

(57) ABSTRACT

A traction energy storage system including multiple electrical energy stores and a system controller. Each of the energy stores includes one or more cell modules electrically connected via busbars, an energy store high-voltage interface connectable to the busbars and an energy store controller controlling the cell modules. Each of the cell modules comprises multiple storage cells and a cell module controller. Each of the cell module controllers is configured to output measured values relating to the storage cells in the respective cell module to the energy store controller. Each of the energy store controllers is configured to take the measured values obtained as a basis for generating signals having electrical characteristic quantities of the respective energy store and at least one limit value for a current through the energy store high-voltage interface of the respective energy store.

16 Claims, 7 Drawing Sheets

(51) Int. Cl.
    *H01M 10/42* (2006.01)
    *B60L 3/04* (2006.01)
    *H01M 2/10* (2006.01)
    *H01M 10/44* (2006.01)
    *B60L 3/12* (2006.01)
    *H01M 2/20* (2006.01)
    *H01M 10/48* (2006.01)
    *B60K 1/04* (2019.01)
    *B60L 50/60* (2019.01)
    *B60L 58/13* (2019.01)
    *B60L 58/14* (2019.01)
    *B60L 50/64* (2019.01)
    *B60L 58/21* (2019.01)
    *B60L 58/19* (2019.01)
    *B60L 58/15* (2019.01)
    *G01R 31/396* (2019.01)

(52) U.S. Cl.
    CPC ............. *B60L 50/64* (2019.02); *B60L 50/66* (2019.02); *B60L 58/13* (2019.02); *B60L 58/14* (2019.02); *B60L 58/15* (2019.02); *B60L 58/19* (2019.02); *B60L 58/21* (2019.02); *H01M 2/1077* (2013.01); *H01M 2/206* (2013.01); *H01M 10/425* (2013.01); *H01M 10/441* (2013.01); *H01M 10/482* (2013.01); *H02J 7/0013* (2013.01); *H02J 7/0026* (2013.01); *B60L 2240/547* (2013.01); *B60L 2240/549* (2013.01); *B60L 2260/44* (2013.01); *B60L 2260/50* (2013.01); *B60Y 2304/072* (2013.01); *G01R 31/396* (2019.01); *H01M 2010/4271* (2013.01); *H01M 2010/4278* (2013.01); *H01M 2220/20* (2013.01); *H02J 7/00302* (2020.01); *H02J 7/00306* (2020.01); *Y02T 10/7005* (2013.01); *Y02T 10/7055* (2013.01); *Y02T 10/7061* (2013.01)

(56) References Cited

U.S. PATENT DOCUMENTS

| | | | |
|---|---|---|---|
| 2007/0080662 A1 | 4/2007 | Wu | |
| 2012/0053771 A1* | 3/2012 | Yoshida | B60L 55/00 701/22 |
| 2014/0094985 A1* | 4/2014 | Hibiya | H01M 10/44 700/297 |
| 2015/0025824 A1 | 1/2015 | Henrici et al. | |
| 2015/0280294 A1* | 10/2015 | Shin | H01M 10/625 429/50 |
| 2016/0254683 A1* | 9/2016 | Matsumoto | B60L 58/13 320/118 |

FOREIGN PATENT DOCUMENTS

| | | |
|---|---|---|
| DE | 102012202079 A1 | 8/2013 |
| DE | 102013000907 A1 | 7/2014 |
| DE | 102014223278 A1 | 5/2016 |
| EP | 2541641 A1 | 1/2013 |
| EP | 2560265 A1 | 2/2013 |
| EP | 2712046 A1 | 3/2014 |
| EP | 2993724 A1 | 3/2016 |
| EP | 3244477 A2 | 11/2017 |
| EP | 3273507 A1 | 1/2018 |
| EP | 3309003 A1 | 4/2018 |

\* cited by examiner

TRACTION ENERGY STORAGE SYSTEM WITH DETERMINATION OF OPERATING LIMITS

BACKGROUND

1. Technical Field

The present disclosure relates to a traction energy storage system for a vehicle, for example for a commercial vehicle. In particular a traction energy storage system that takes into consideration variable operating limits.

2. Description of Related Art

The partial electrification of the drivetrain of a vehicle is cost intensive. A substantial contribution to the costs is made by the development and testing of the energy store. The number of different instances of application and the development and testing complexity associated therewith multiply the costs. The number of instances of application is determined by multiple factors. First, there is often a desire to electrify as large a number of vehicle derivatives as possible. Second, any vehicle derivative regularly has the need for different degrees of electrification, for example a battery electric vehicle (BEV), a plug-in hybrid electric vehicle (PHEV) and a hybrid electric vehicle (HEV).

The document DE 10 2010 002 939 A1 describes a conventional energy store. The energy store comprises a multiplicity of single storage cells, with respective groups of storage cells being interconnected to form a storage module and the storage modules being interconnected to form the energy store.

The document US 2007/0080662 A1 describes a further conventional energy store that, beyond the power interconnection, has a data bus. The data bus connects module controllers on the single cell modules to a controller of the energy store.

The document DE 10 2007 038 532 A1 describes an energy store having multiple cells connected to one another that each provide a voltage, this energy store being referred to as a battery pack. One or more cells has/have an associated monitoring circuit. A coupling arrangement takes the monitoring circuits as a basis for providing a state signal that is DC-isolated from the cells.

In order to cope with the multiplicity of different instances of application, the conventional energy store needs to be developed and tested for each instance of application vis-à-vis the number of cell modules it has, the control of the energy store and its intrinsic safety.

Growing demands on the stored traction energy, particularly for commercial vehicles, require a larger number of storage cells. Owing to different influencing factors such as temperature, manufacturing tolerance, self-discharge, ageing, etc., electrical properties of the storage cells drift apart over the course of use. Since as many storage cells as possible are directly or indirectly electrically connected to one another, however, individual current and/or power regulation per system is not possible.

SUMMARY

It is therefore an object of the present disclosure to provide a technique for storing traction energy by means of a vehicle-adapted number of storage cells that takes into consideration the operating conditions of the storage cells during use.

This object is achieved by a traction energy storage system for a vehicle having the features described herein.

According to one aspect, a traction energy storage system (TES system) comprises multiple electrical energy stores (TESs). Each of the TESs comprises one or more cell modules electrically connected via busbars, an energy store high-voltage interface (TES high-voltage interface) connected or connectable to the busbars and an energy store controller (TES controller) controlling the cell modules. Each of the cell modules comprises multiple storage cells and a cell module controller. Each of the cell module controllers is configured to output measured values relating to the storage cells in the respective cell module to the TES controller. Each of the TES controllers is configured to take the measured values obtained as a basis for generating a signal or signals having electrical characteristic quantities of the respective TES and at least one limit value for a current through the TES high-voltage interface of the respective TES. The TES system further comprises a system controller that is configured to obtain the signals from the TES controllers, to take the characteristic quantities of all the TESs as a basis for computing the current for each of the TES high-voltage interfaces when the TES high-voltage interfaces are connected in parallel, and to take the computed currents and the limit values for the currents as a basis for determining the system limit value for the sum of the currents and to output said system limit value as a system signal.

The characteristic quantities of the TESs can each comprise a state of charge (SoC), an internal resistance and/or an open-circuit voltage (OCV) of the respective TES. The characteristic quantities of the respective TES can indicate the internal resistance and the open-circuit voltage of the respective TES or may be dependent on the open-circuit voltage and the internal resistance of the respective TES.

The measured values of the storage cells and/or of the cell modules can each indicate a state of charge, an internal resistance and/or an open-circuit voltage of the storage cell or of the cell module. Each TES controller can take the measured values in the respective TES as a basis for computing the characteristic quantities.

The sum of the currents is also referred to as the system current. The standard voltage of the parallel-connected TES high-voltage interfaces is also referred to as the system voltage.

The limit values of the TESs and/or the system limit values of the TES system can each indicate a current and/or a voltage. The TES limit values and/or the system limit values can each indicate an upper limit and/or a lower limit. The TES limit values and/or the system limit values can each indicate a value for a discharging mode of operation and a value for a charging mode of operation.

The system limit value for the system current and/or further system limit values (for example for the system voltage) in regard to the operation of the TES system are also referred to as system operating limits. The limit values for the currents of the TESs and/or further limit values (for example for the voltages of the TESs) in regard to the operation of the TESs are also referred to as TES operating limits. The system operating limits and/or the TES operating limits can each comprise a charging current, a discharge current, a charging voltage, a discharge voltage, a charging power and/or a discharge power of the TES system or of the respective TES, for example a maximum and/or a minimum of one or more of these quantities.

The TES system can also be referred to as a TES system or, to emphasize the plurality of TESs comprised, as a multi-TES system. The TES system may be modular and/or scalable on the basis of the plurality of the TESs. The plurality of the TESs means that the TES system can have a vehicle-adapted storage capacity.

A distribution of electrical properties and/or chemical states of the multiplicity of storage cells can broaden during use, for example on account of different ambient temperatures, manufacturing tolerance, self-discharge and/or ageing. This means that the characteristic quantities of the TESs can differ and/or vary.

The technique allows dynamic determination (for example an estimation based on the present and/or forecast based on a future period) of one or more system operating limits. The system controller may be configured to compute the system operating limits at runtime. The system operating limits can be determined for a forecast period, for example on the basis of the TES operating limits obtained for the forecast period. The forecast period can comprise e.g. the next 10 seconds.

Optionally, the system controller is configured to output the determined system operating limits (for example the system limit value for the system current and/or the system voltage) to the vehicle. The system controller may further be configured to determine and/or output the system operating limits periodically.

The determined system operating limits may be dependent on a combination of the TES operating limits. The determined system operating limits may be directly or indirectly dependent on temperature, time of use and/or state of charge of the TESs.

Each cell module controller can comprise a scope of functions that is known from the prior art. Each TES controller can comprise a scope of functions (also: slave scope of functions) that is known from the prior art. The system controller can have a scope of functions (also: master scope of functions) going beyond that, which coordinates the TESs among one another and/or computes the system limit values, for example. The computation of the single TES currents, the determination of the system limit values and/or the output of the system limit values or of another system signal may be part of the master scope of functions.

The TES system can comprise at least two TESs connected up in parallel. Each TES can comprise multiple storage cells connected up to one another in parallel and/or in series.

A certain number of storage cells may be combined with one of the cell module controllers to form a respective one of the cell modules. The cell modules within each TES may be connected in series or parallel.

At least one cell module in each TES has a signal interchange link to the respective TES controller. The signal interchange link may be a logical connection.

The system controller may further be configured to determine a discrepancy between the characteristic quantities of the TESs. The discrepancy can comprise a variance in the characteristic quantities and/or a difference between the minimum and maximum of the characteristic quantities of all the TESs. The system controller can determine and/or output the system limit values in reaction to a threshold value for the discrepancy being exceeded.

Alternatively or additionally, the characteristic quantities can be determined at the request of the system controller. The system controller may further be configured to obtain vehicle instructions from a vehicle. A control instruction from a vehicle can cause the system limit values to be determined and/or output. Each TES controller may further be configured to query the measured values at the request of the system controller.

The computing of the currents through the parallel-connected energy store high-voltage interfaces can determine the currents as a function of the system current and/or the system voltage sum. The characteristic quantities may be parameters of this function.

The system controller may be configured to determine the system limit value(s) for the system current by maximizing and/or minimizing the system current while observing the limit values of all the TESs. Alternatively or additionally, the system controller may be configured to determine the system limit value(s) for the system current by determining a limiting limit value among the limit values of all the TESs that limits the system current as a function of the currents of the TESs.

The system controller may further be configured to take the computed currents of the TESs and the limit values for the currents as a basis for determining a system limit value for the system voltage. Alternatively or additionally, the system controller may be configured to determine the system limit value for the system voltage on the basis of the system limit value for the system current. Optionally, the system controller outputs the system limit value of the system voltage as a system signal, for example together with the system limit value of the system current.

The currents through the parallel-connected TES high-voltage interfaces can be computed as a function of the system voltage. The system controller may be configured to determine the system limit value(s) for the voltage by maximizing and/or minimizing the system voltage while observing the limit values of all the TESs.

The TESs can generate the respective limit values for the charging and for the discharge of the respective TES. The system controller can determine and/or output the respective system limit value(s) for the charging and for the discharge of the TES system.

The characteristic quantities and/or the limit values of the TESs may be time-dependent, for example as a function of time or a corresponding list of time-dependent values. The characteristic quantities and/or the limit values of the TESs may be associated with a forecast period. The system limit value(s) can be determined and/or output as a function of time or a corresponding list of time-dependent values. The system limit value(s) may be associated with the forecast period. The limit values obtained for the TESs and/or the computation of the system controller may be based on continual, optionally constant, currents within the forecast period.

Each TES can comprise at least one contactor. The TES controller can control the contactor or the contactors. In each TES, the contactor or the contactors may be configured to connect the busbars of the TES to the TES high-voltage interface of the respective TES in a closed position of the contactor, and to disconnect them in an open position of the contactor, as stipulated by the TES controller. By way of example, two respective contactors can connect and disconnect one pole of the busbars to/from the TES high-voltage interface.

The TES high-voltage interfaces (of single TESs or TESs connected in series in clusters) may be connected in parallel in the TES system. The system controller may be configured to cause the closed position of the contactors of all the TESs or of a subset of the TESs in an operating state of the TES system and/or to cause the open position of the contactors of all the TESs in an idle state of the TES system. The operating state can comprise the discharging mode of operation and/or the charging mode of operation.

The contactor may be configured to connect the TES high-voltage interface of the TES to the cell modules connected up to one another in the closed position and to disconnect them therefrom in the open position. The busbars of each TES can each comprise a negative rail and a positive rail having a higher potential than the negative rail. The TES high-voltage interfaces can each comprise a negative pole and a positive pole. The busbars may be connected to the TES high-voltage interface in the closed position by virtue of the positive rail and the negative rail being connected to the positive pole and the negative pole, respectively. The busbars may be disconnected form the TES high-voltage interface in the open position by virtue of the positive rail being disconnected form the positive pole, for example when the negative rail is connected to the negative pole.

The parallel-connected TES high-voltage interfaces may further be connected to the vehicle for the interchange of energy. A power system (for example a high voltage distribution unit) of the vehicle may be connected to the parallel-connected TES high-voltage interfaces. The interchange of energy may be restricted to the operating state. A flow of current between TES system and the vehicle (for example a converter or inverter of the vehicle) may be interrupted in the idle state.

The TES system can further comprise a system high-voltage interface and/or a system contactor. The system high-voltage interface is electrically connected or connectable to the vehicle, for example to a drivetrain of the vehicle. The system contactor is configured to connect the parallel-connected TES high-voltage interfaces to the system high-voltage interface (in a closed position of the system contactor) and to disconnect them therefrom (in an open position of the system contactor) as stipulated by the system controller. The system controller can cause the closed position of the system contactor in the operating state. The system controller may further be configured to cause the open position of the system contactor in the idle state.

Each of the cell module controllers may be configured to output measured values relating to the storage cells in the respective cell module. Each of the TES controllers may be configured to obtain the measured values from the cell modules in the respective TES and to take the measured values obtained as a basis for generating the signal. The characteristic quantities and limit values output by the TES controllers are collectively referred to as the storage state of the respective TES.

One of the TES controllers can carry out the function of the system controller. This one TES controller can also be referred to as a master TES controller. Every further TES controller of the TES system can also be referred to as a slave TES controller.

The function of the system controller may be implemented in any of the TES controllers and, in one of the TES controllers, may be activated to be carried out. The function of the system controller may be activated to be carried out in only one of the TES controllers. In all the other TES controllers, the function of the system controller may be deactivated. Each of the TES controllers may be configured to carry out the function in a first energy store operating state and not to carry out the function in a second energy store operating state.

Each of the TESs can further comprise a first data interface and/or a second data interface, which is different from the first data interface. The data interfaces (or a subset thereof) may be connected to the TES controller inside the TES.

In the case of those TESs that do not carry out the function of the system controller, the first data interface may be unconnected outside the TES or dispensed with. Alternatively or additionally, in the case of those TESs, the second data interface, to output the signal, may be connected to the second data interface of the TES that carries out the function of the system controller.

In the case of that TES that carries out the function of the system controller, the first data interface may be connected to the vehicle outside the TES to output the system limit value or another system signal. Alternatively or additionally, the second data interface of that TES, to obtain the signals, may be connected to the second data interfaces of the TESs that do not carry out the function of the system controller. The second data interfaces of all the TESs may be connected to a shared data bus.

The system controller may be configured to aggregate the signals obtained to boost the system signal, and to output the aggregated system signal, e.g. in the operating state of the TES system. The aggregation of the multiple signals to produce a system signal by the system controller can allow a standard signal output (or communication) to the vehicle. By way of example, different vehicle derivatives and/or vehicles having different degrees of electrification of the drivetrain can use a standard communication interface for the TES system.

A design of the vehicle-end communication interface and a protocol for the vehicle-end communication of the TES system may be the same for different instances of application. The instances of application may differ in terms of the number and interconnection of the TESs. The number and interconnection of the TESs can be matched to an energy and power demand of the vehicle, without adapting the vehicle-end communication.

The hierarchically structured TES system having the TESs on one hierarchy level and the cell modules on an underlying hierarchy level can allow determination of the system limit values for the TES system, the duration of which (for example including measurement) does not increase or does not increase linearly with the number of storage cells or cell modules. By way of example, each TES controller may be configured to determine the characteristic quantities in parallel, on the basis of the measured values obtained from the cell module controllers.

If the characteristic quantities of a TES differ by more than a threshold value (for example in absolute or percentage terms) in comparison with the characteristic quantities of the other TESs (or a mean value of the characteristic quantities), the system controller can remove this TES from the parallel circuit (for example by virtue of the open position of the applicable contactor). The exclusion of the TES can be output to the vehicle in an error message or diagnosis report. By way of example, one of the TESs may be indicated as faulty or aged. Further, the diagnosis report can indicate a single cell module (for example as faulty or aged) on the basis of cell-module-specific measured values.

This is advantageous, for example, if the system limit value of the TES system is dependent on the weakest-power TES or cell module. Targeted replacement of the indicated TES or cell module can restore the performance of the TES system effectively in terms of time and cost.

The TES controller of each TES may be connected to the respective cell module controllers of the same TES for data interchange, for example via a serial data bus. The measured values can indicate a voltage (e.g. a module voltage of all the storage cells) and/or a temperature (e.g. a module temperature, a mean temperature value or a maximum temperature) of the cell modules.

Each cell module controller may be configured to capture the measured values and/or to output them to the respective connected TES controller. The cell module controller may be arranged so as to be adjoining or in contact with at least one of the respective storage cells. Sensors for capturing the measured values may be arranged in the cell module controller.

The signals and/or the system signal can indicate the measured values, a state value or a diagnosis value. The aggregation of the signals to produce the system signal can comprise the formation of a mean value, determination of a minimum and/or determination of a maximum.

The system controller may be configured for bidirectional communication with the vehicle. The system controller may be configured to obtain a vehicle signal. The system controller can analyse the vehicle signal and, on the basis of the analysis, output a control signal to at least one of the TES controllers. The vehicle signal can comprise a control instruction (e.g. the vehicle instruction) and/or a state query.

The system controller may be configured to use the first data interface to obtain an emergency shutdown signal from the vehicle. The system controller may further be configured to send a control signal to disconnect the contactors to the TES controllers when the emergency shutdown signal is obtained.

The aggregated system signal can indicate a system state of the TES system. A data format to indicate the state, a physical definition of the respective data interface used and/or a communication protocol may be consistent for the signals and the aggregated system signal.

The storage state and the system state can indicate a present state of the respective TES or of the TES system. Alternatively or additionally, the storage state and the system state can indicate a (e.g. forecast) performance of the respective TES or of the TES system. The signals from the TES controllers can indicate a present state of charge and/or a maximum current (e.g. drawable in the future) of the respective TES. The state of charge can be determined from the measured voltage (e.g. the open-circuit voltage), for example by means of a tabulated charging curve. The drawable maximum current can be determined from the state of charge and/or the measured temperature, for example by means of a tabulated function. Any TES controller not carrying out the function of the system controller can output a separate signal (e.g. with a separate data record and/or by means of a separate datagram) to the TES controller carrying out the function of the system controller.

The TES controllers may each be configured to establish the storage state of the respective TES, for example on the basis of the measured values and/or further measured values of the TES controller that are obtained from the cell modules. The TES controller may further be configured to disconnect the respective contactor or the respective contactors and/or to generate an error message as the signal and to output it to the system controller when an inadmissible storage state is established. The signal from the relevant TES controller can name the inadmissible storage state and/or indicate the inadmissibility as such.

Establishment of the storage state can comprise measuring the current delivered by the respective TES. The inadmissible storage state can be established when the drawable maximum current is exceeded. Alternatively or additionally, the signals can each indicate the drawable maximum current of the respective TES as one of the limit values.

The aggregated system signal can comprise the system limit value(s). Optionally, the system limit value(s) is/are determined to the exclusion of those TESs for which an inadmissible storage state is established or signalled.

Establishment of the state can comprise determining the state of charge of the respective TES or of a charge drawable from the respective TES. The inadmissible storage state can be established when there is a drop below a minimum charge. The generated signals can each indicate the state of charge or the drawable charge of the respective TES. The system state can indicate the sum of the signalled drawable charges.

The drawable charge can be determined by integration of the current with respect to time. Alternatively or additionally, the drawable charge can be determined on the basis of the measured voltage by means of a tabulated function.

Each TES can comprise an earth conductor contact. The earth conductor contact may be connected or connectable to a bodywork of the vehicle. The establishment of the state can comprise measuring the insulation resistance between one pole (or both poles) of the TES high-voltage interface and the earth conductor contact of the respective TES. The inadmissible storage state can be established when there is a drop below an insulation resistance value.

Each of the TESs may be arranged in a separate housing. One or more outer faces of the housing can have at least one of the following features arranged in it: the first data interface, the second data interface, the TES high-voltage interface and the earth conductor contact.

According to further aspects, a vehicle, for example a commercial vehicle, having such a TES system, and also a method for producing a vehicle having a step of determining the number of energy stores for the vehicle and a step of installing the vehicle-specific TES system, are provided.

Features described above can be realized in any combination.

BRIEF DESCRIPTION OF THE FIGURES

Further features and advantages of the present disclosure are described below with reference to the appended drawings, in which.

DETAILED DESCRIPTION

Figure 1:
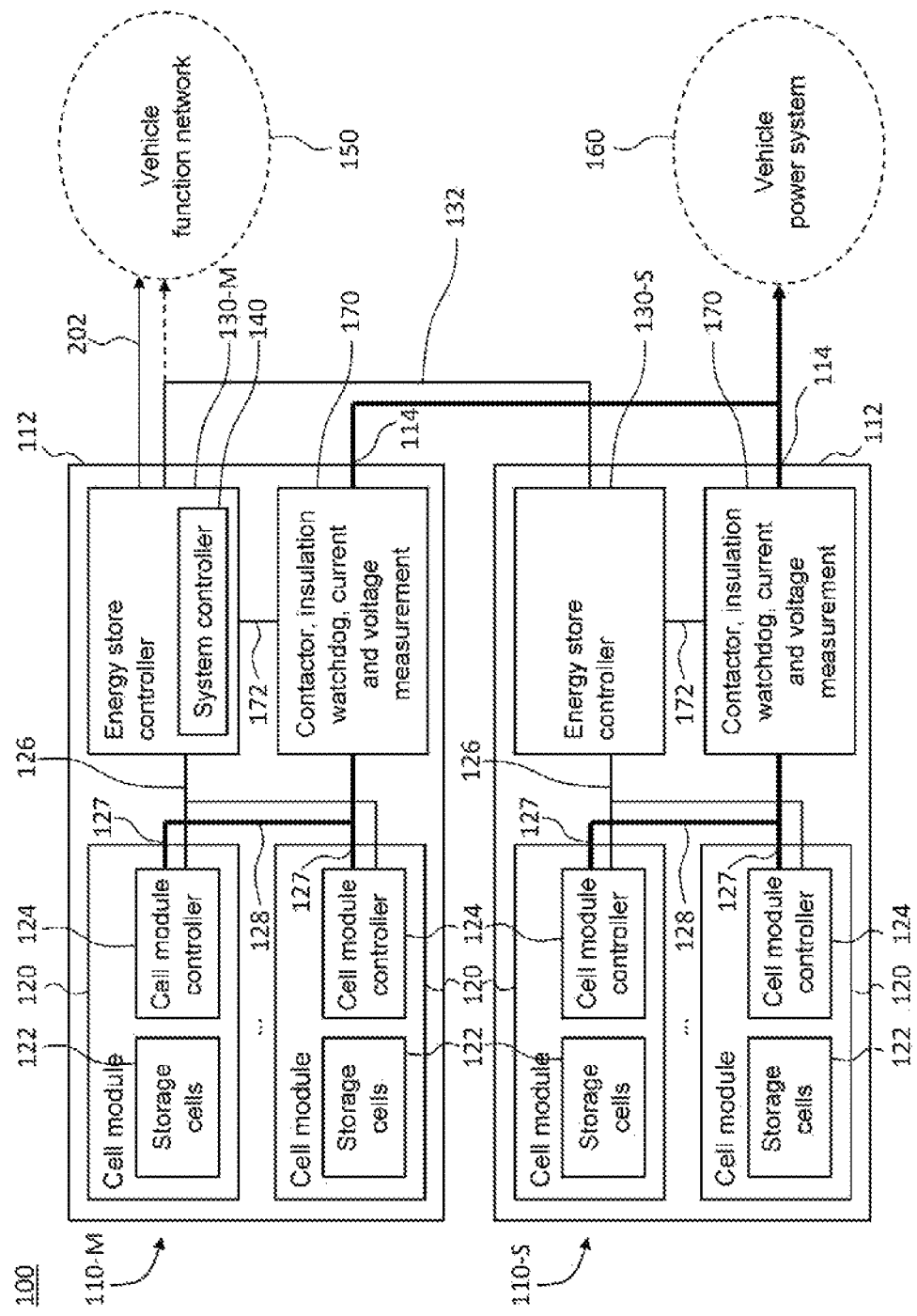
FIG. 1 shows a schematic block diagram of a first exemplary embodiment of a traction energy storage system for a vehicle.

FIG. 1 shows a schematic block diagram of a traction energy storage system (TES system), denoted generally by reference symbol 100, for a vehicle, for example a commercial vehicle. The TES system 100 comprises at least two energy stores 110 (also: traction energy stores or TESs). Each TES 110 respectively comprises multiple cell modules 120 and an energy store controller 130 (also: traction energy store controller or TES controller).

Each of the cell modules 120 comprises multiple storage cells 122 and a cell module controller 124. Each cell module controller 124 captures measured values relating to the respectively associated storage cells 122. For example, the cell module controller 124 captures a voltage and/or a temperature of the storage cells 122 in the respective cell module 120. Each of the cell module controllers 124 is configured to output the measured values on an internal data bus 126. The internal data bus 126 of the cell module 120 may be a serial bus, for example for a controller area network (CAN).

Each of the TES controllers 130 is configured to obtain the measured values from the cell modules 120 in the respective TES 110. To this end, each TES controller 130 is connected to the respective internal data bus 126.

Each of the TES controllers 130 is further configured to take the measured values obtained as a basis for generating a signal. To output the signal or other signals, the TES controller 130 is connected to an external data bus 132. The external data bus 132 of the TES system 100 may be a serial bus, for example a further CAN bus. The external data bus 132 may be configured exclusively for communication between the TESs 110 (or the TES controllers 130 thereof).

The TESs 110 are each arranged in a separate housing 112. The internal data bus 126 runs inside the respective housing 112. The external data bus 132 runs outside the housing 112.

The TES system 100 further comprises a system controller 140 that obtains signals from the TES controllers 130. The signals from the TES system controllers 130 can comprise electrical characteristic quantities of the respective TES 110. On the basis of the signals obtained, the system controller 140 generates a system signal. The system signal can comprise operating limits, for example system limit values for the current and/or the voltage, of the TES system 100. The system controller outputs the system signal to a function network 150 of the vehicle. The function network 150 can comprise a low-voltage vehicle electrical system and/or a bus system for communication between vehicle functions. The low-voltage vehicle electrical system can provide a supply voltage of 24 volts.

In a first variant, the external data bus 132 may be configured exclusively for communication between the TESs 110 (or the TES controllers 130 thereof). The function network 150 may be connected to the system controller 140 via a separate interface and/or a separate bus link 202. To this end, a separate bus (for example a separate CAN bus) for vehicle communication may be provided that operates independently of the external data bus 132.

In a second variant, the external data bus 132 (instead of the separate bus link 202 or in addition thereto) may be connected to the function network 150 (dashed arrow).

In both variants, the TES system 100 can comprise a standard vehicle interface for the function network 150 of the vehicle, which vehicle interface is independent of the number of TESs 110 used and connected to one another. Particularly in the case of the first variant, the vehicle interface may be on a physical plane (e.g. in respect of plug connection and/or signal profile) or a physical layer (e.g. in respect of a communication protocol) independently of a variable composition of the TESs 110 that the TES system 100 comprises.

The system controller 140 may be implemented in a TES 110, for example in one of the TES controllers 130. Alternatively or additionally, the system controller 140 may be implemented outside the TESs 110, for example as a separate apparatus in a separate housing or a component of the function network 150. A TES 110 that carries out the function of the system controller 140 is also referred to as a master TES 110-M. The TES(s) 110 that do/does not carry out the function of the system controller 140 is/are also referred to as (a) slave TES(s) 110-S. Corresponding designations apply to the respective TES controllers 130-M and 130-S.

The system controller 140 obtains the signals from the TES controllers 130-S via the external data bus 132. The system signal can be output to the function network 150 by the system controller 140 by means of a direct connection from the system controller 140 to the function network 150. Alternatively or additionally, as in the exemplary embodiment shown in FIG. 1, the system signal can be output to the function network 150 via the external data bus 132. To this end, the function network 150 is connected (for example directly or via a gateway) to the external data bus 132.

The storage cells 122 of a cell module 120 are interconnected (for example in series). The connection terminals 127 resulting from the interconnection are connected via busbars 128. The busbars 128 may be made from aluminium or another conductive material.

The poles resulting from the interconnection of the cell modules 120 of each TES 110 form a TES high-voltage interface 114. The TES high-voltage interfaces 114 are interconnected in parallel or in series and connected or connectable to a power system 160 of the vehicle. The power system 160 can comprise a high voltage vehicle electrical system of the vehicle. A drive train (for example a crankshaft starter generator) of the vehicle may be connected to the power system 160 to draw the energy stored in the TES system 100 and/or to charge the TES system 100, for example in a regenerative braking process. The power system 160 can also be referred to as a traction network. The power system 160 can provide a voltage of at least 60 volts, for example between 540 volts and 738 volts. Alternatively or additionally, the power system 160 may be any high voltage vehicle electrical system within the context of vehicle construction. A topology of the power system 160 and/or the components thereof can distinguish the power system 160 from a low voltage system (of 24 volts, for example). The topology may correspond to or match a known vehicle topology for hybrid, plug-in or electric vehicles. The components can comprise a converter (or inverter) for traction drives, the TES system 100, one or more electric machines, secondary units and/or a harness.

Preferably, each TES 110 has at least one contactor 170 arranged in it between the cell modules 120 and the power system 160. The contactor 170 or the contactors 170 is/are controlled by the TES controller 130 in the same TES 110 via the control line, shown with reference symbol 172, to selectively disconnect the respective TES 110 from the power system 160. The contactor 170 may be part of a contactor box that further monitors the electrical insulation of the busbars 128 (e.g. from a reference potential), measures the current flowing via the busbars 128 and/or measures the voltage applied to the busbars 128.

In an operating state of the TES system 100, the contactors 170 of all the (operational) TESs 110 are closed (closed position). By opening the contactor 170 or the contactors 170, the applicable TES 110 can be insulated from the interconnection of the TES system 100 in the operating state of the TES system 100, for example in the event of an inadmissible storage state. By opening the contactor 170, the applicable TES 110 can be excluded from an interchange of charge, for example if the electrical characteristic quantities thereof differs from the electrical characteristic quantities of the other TESs 110 by more than a threshold value. By means of the respective TES controller 130, the system controller 140 causes the open position of the contactors 170 of all the TESs 110 in the idle state of the TES system 100.

In addition, a precharge contactor and a precharge resistor connected in series with the precharge contactor in each TES 110 may be installed in parallel with one of the contactors 170 (which can also be referred to as main contactors). The precharge resistor may be a positive temperature coefficient resistor. Immediately before the closed position (e.g. for the operating state), the TES controller 130 can close the precharge contactor. The TES controller 130 can cause the closed position of the contactors 170 as soon as a voltage difference on the precharge resistor drops below a threshold value.

The system controller 140 is further configured for bidirectional communication with the function network 150 of the vehicle. By way of example, the system signals can be generated and output in reaction to a vehicle signal. Further, the vehicle signal can comprise a control instruction. The system controller 140 analyses the control instruction to determine those TESs 110 that are relevant to the implementation of the control instruction, and outputs a control signal to the TES controllers 130 of the relevant TESs 110.

The TES system 100 can be used in scalable fashion on the level of the TESs 110 owing to the modular design. The TESs 110 are repeatedly interconnectable in parallel or in series. The choice of interconnection and of the number of interconnected TESs 110 renders the TES system 100 configurable for a vehicle-specific power and energy requirement. These requirements are dependent on the degree of electrification of the drive train of the vehicle. Further, the power requirement may be determined by a transport capacity of the vehicle, for example of the commercial vehicle, and the energy requirement may be determined by a range of the vehicle.

The system controller 140 provides a standard data interface for the vehicle in respect of a physical interface and a communication protocol, which data interface is independent of the vehicle-specific configuration of the TES system 100. The multiple TESs 110 behave in the manner of a correspondingly large TES toward the vehicle on account of the communication via the system controller 140. This minimizes a vehicle-specific integration complexity.

Figure 2:
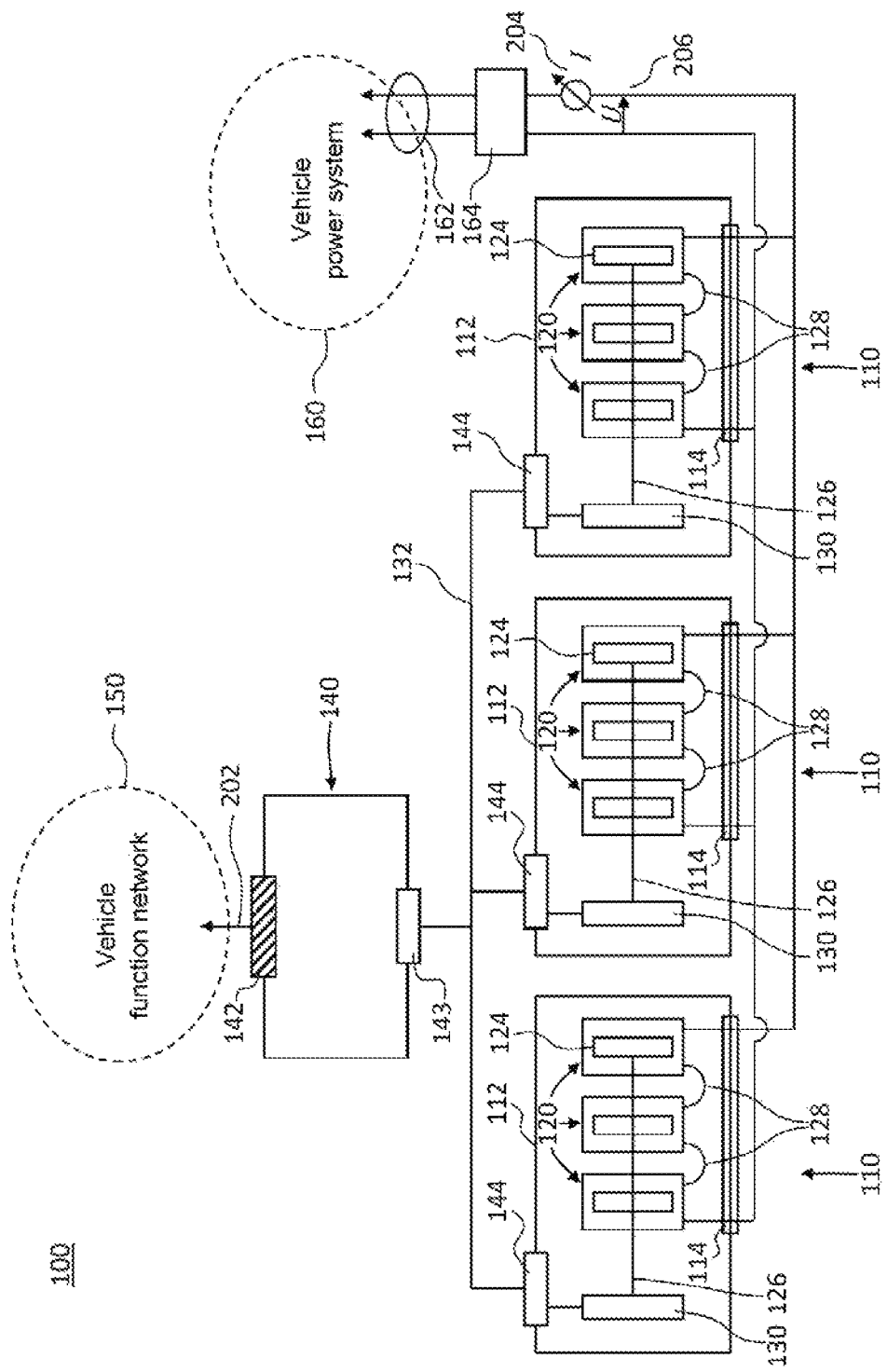
FIG. 2 shows a schematic block diagram of a second exemplary embodiment of a traction energy storage system for a vehicle.

FIG. 2 shows a schematic block diagram of a second exemplary embodiment of a TES system 100. Reference symbols consistent with the other exemplary embodiments denote corresponding or identical features.

The system controller 140 is arranged outside the housing 120 of the TESs 110. The system controller 140 comprises a first data interface 142 for vehicle-end communication. By way of example, the first data interface 142 is connected to the function network 150 and/or a motor controller. Further, the system controller 140 comprises a second data interface 143 that is connected to data interfaces 144 of the TESs 110 via the external data bus 132. The system controller 140 obtains the signals from the single TESs 110 via the second data interface 143. The system signal is output via the first data interface 142.

The TES high-voltage interfaces 114 of the single TESs 110 are connected up in parallel and connected to the power system 160 and/or an inverter of the vehicle. In each exemplary embodiment, a system high-voltage interface 162 may be provided for the interchange of energy between the TES system 100 and the power system 160 of the vehicle. The current I through the system high-voltage interface 162 is referred to as the system current 204. The standard voltage U of the parallel circuit is applied to the system high-voltage interface 162 and is referred to as the system voltage 206. On account of the parallel connection, the system current 204 can also be referred to as the total current of the TES system 100.

A system contactor 164 controlled by the system controller 140 allows the system high-voltage interface 162 to be switched to zero voltage. Alternatively, the system contactor 164 may be arranged in a high voltage distribution unit of the power system 160. In this case, the system contactor 164 can be controlled directly (for example via the external data bus 132) or indirectly (for example via a component of the function network 150) by the system controller 140.

The first data interface 142 is connected to a serial bus 202 of the vehicle function network 150, for example a CAN bus that is independent of the TES system 100.

Figure 3:
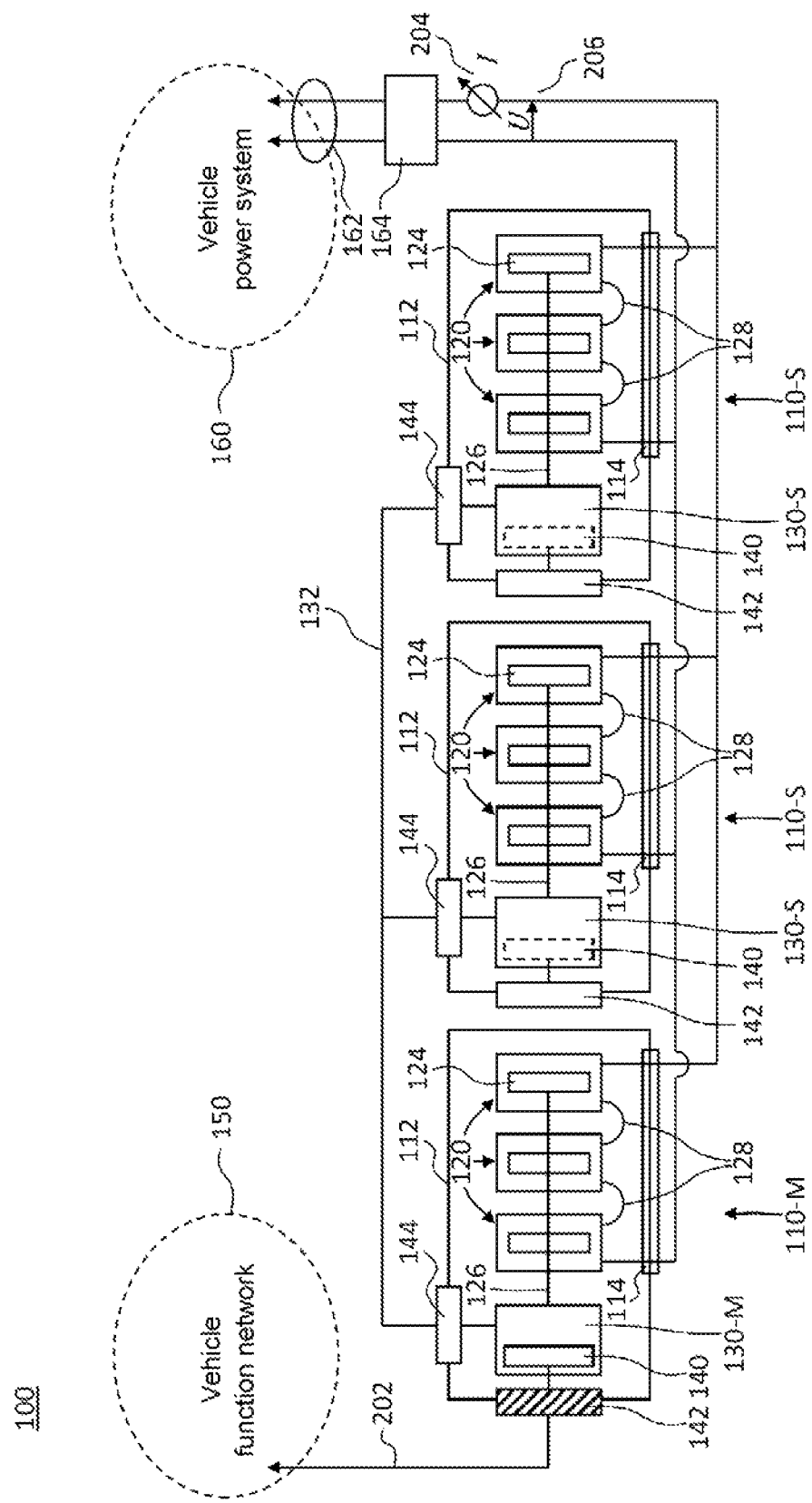
FIG. 3 shows a schematic block diagram of a third exemplary embodiment of a traction energy storage system for a vehicle.

FIG. 3 shows a schematic block diagram of a third exemplary embodiment of a TES system 100 for a vehicle. The third exemplary embodiment differs from the second exemplary embodiment in that the function of the system controller 140 is carried out in a TES 110-M of the TESs 110. To this end, the TES 110-M comprises the first data interface 142. A second data interface 144 is used by the TES 110-M to obtain the signals from the other TESs 110-S, which do not carry out the function of the system controller 140. The first data interface 142 and the second data interface 144 are each connected in the TES 110-M to the TES controller 130-M that carries out the function of the system controller 140.

All the TESs 110-M and 110-S (or at least the TES controllers 130-M and 130-S thereof) are preferably of the same design. The TESs 110-S can also comprise a first data interface 142 that is unconnected outside the TES 110-S. The second data interfaces 144 of all the TESs 110-M and 110-S are connected via the external data bus 132.

In a preferred configuration, the function of the system controller 140 is also implemented in each TES controller 130-S of the TESs 110-S and not activated to be carried out (shown as a dashed function block in FIG. 3). By setting one or more parameters of the TES controller 130, it is possible for the function of the system controller 140 to be selectively activated and deactivated to be carried out.

The parallel connection of the three TES high-voltage interfaces 114 that is shown in FIGS. 2 and 3 is exemplary. Depending on the requirements of the vehicle power system 160 (e.g. in respect of current, voltage, power and/or energy), it is possible for a larger number of TESs 110 and/or a different interconnection of the TES high-voltage interfaces 114 to be used. In particular, the TES high-voltage interfaces 114 may be connected in series inside a respective group of TESs 110, and the groups may be connected in parallel among one another.

Figure 4:
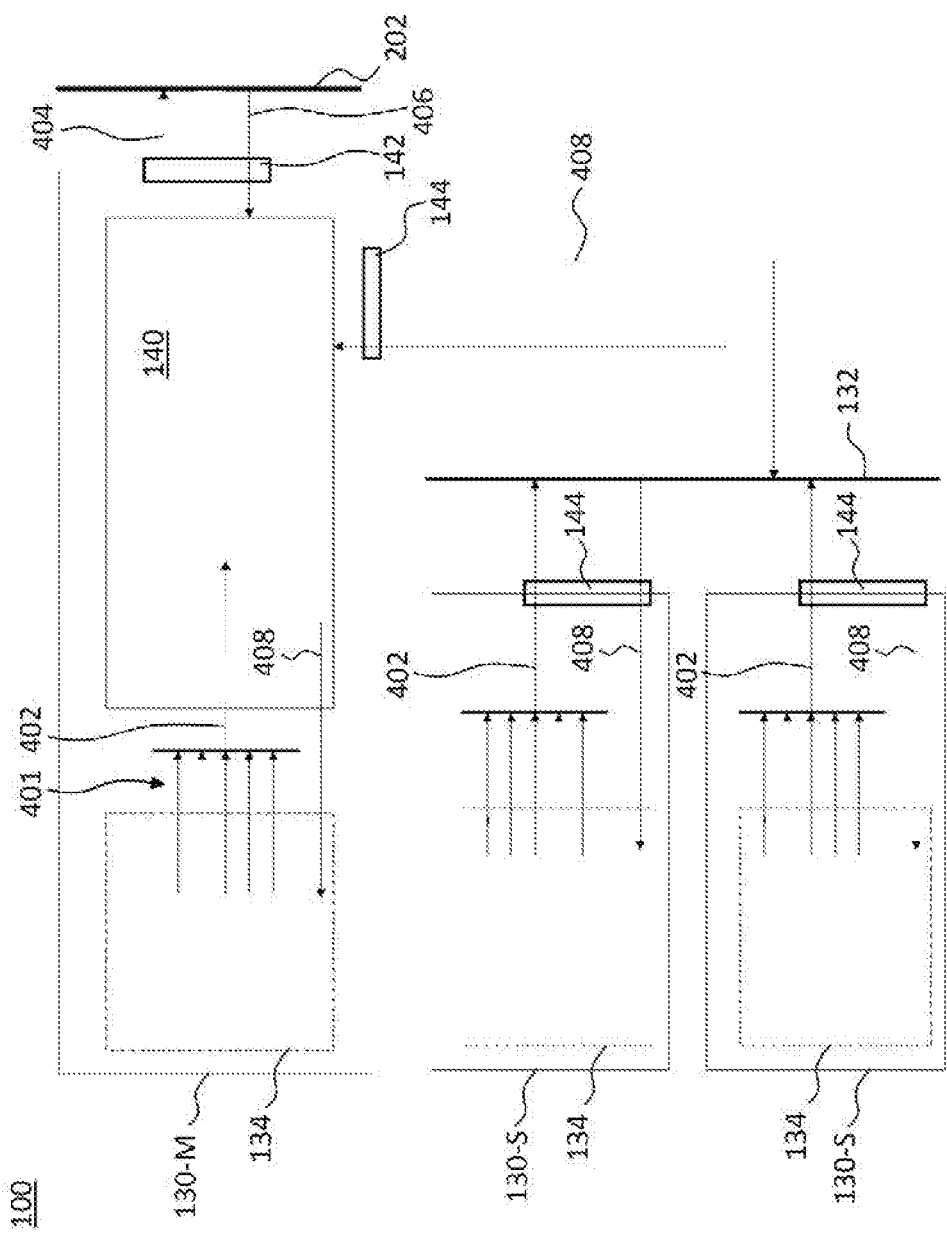
FIG. 4 shows a functional block diagram of exemplary signal processing in the traction energy storage system, which signal processing is implementable in the exemplary embodiments of FIGS. 1 to 3.

FIG. 4 shows a functional block diagram of the TES system 100, the functional features of which are optionally implemented in each of the aforementioned exemplary embodiments. At least some of the functional features may be implemented by an application specific integrated circuit (ASIC) and/or encoded in a memory that is accessed by a processor to carry out the functional features.

The TES controller 130-M that carries out the function of the system controller 140 may be composed of a slave scope of functions 134 and the scope of functions of the system controller 140. The slave scope of functions 134 can correspond to the scope of functions for the standalone operation of a single TES and/or to the operation as a slave TES 110-S. The slave scope of functions 134 may be consistent with the (active) scope of functions of the other TES controllers 130-S. The slave scope of functions 134 can contain an existing scope of functions of a conventional TES. As a result, the TES 110 may be backward-compatible with standalone operation.

Data 401 relating to the storage cells 122 in the TES 110-M (for example the measured values) are multiplexed by the TES controller 130-M into an application format of the system controller 140 (for example as the electrical characteristic quantities) and transferred to the system controller 140 on a virtual or physical interface as the signal 402 from the TES 110-M. Corresponding data (for example the measured values) relating to the storage cells 122 of the respective other TESs 110-S are multiplexed in the respective TES controllers 130-S into the application format of the system controller 140 (for example as the electrical characteristic quantities) and transferred to the system controller 140 as the signal 402 from the TES 110-S on the second data interface 144 of the respective TES 110-S by means of the external data bus 132. On the basis of the signals 402 from the TESs 110, the system controller 140 outputs the system signal 404 on the first data interface 142.

In the opposite communication direction, the system controller 140 can obtain a vehicle signal 406 on the first data interface 142. Optionally, the system controller 140 processes the vehicle signal 406. The system controller 140 forwards the vehicle signal 406 (possibly after the signal processing) selectively or outputs a control signal 408 derived from the vehicle signal 406 to the slave scope of functions 134 of the respectively relevant TES controllers 130-M and/or 130-S.

The configuration of each TES controller 130 as a master TES controller 130-M with an activated function of the system controller 140 or as a slave TES controller 130-S with a deactivated function of the system controller 140 can be achieved by virtue of the function—implemented in all the TES controllers 130—of the system controller 140 carrying out a forwarding function in the deactivated state. The forwarding function forwards the signals 402 (i.e. the multiplexed data) directly to the second data interface 144 of the respective TES 110-S for output. The control signals 408 obtained on the second data interface 144 of the respective TES 110-S are forwarded to the slave scope of functions 134 of the TES controller 130-S.

By way of example, an emergency shutdown signal 406 can be obtained from the vehicle on the first data interface 142. In reaction to the emergency shutdown signal 406 obtained, the system controller 140 outputs a control signal 408 for disconnecting (i.e. switching to zero potential) the TES high-voltage interfaces 114 to the contactor 170 of its own TES 110-M and, via the external data bus 132, to all the other contactors 170.

The first data interface 142 connected to the system controller 140 provides a single communication interface for the vehicle, so that the TES system 100 is the same as a single TES having corresponding storage properties in respect of communication with the function network 150 of the vehicle. Preferably, configuration of the parameters of the TES controller 130 allows every single TES 110 to be selectively configured as an unconnected single TES, as a master TES 110-M in the interconnection of the TES system 100 or as a slave TES 110-S in the interconnection of the TES system 100.

The system controller 140 uses the system signal 404 to output an aggregated shared state (or status) of all the TESs 110 belonging to the TES system 100, for example. Each signal 402 that is output by one of the slave TES controllers 130-S is aggregated in the master TES controller 130-M by the system controller 140 with the corresponding signals 402 (where on hand) from the other TESs 110, and communicated as a shared value as the system signal 404 outwards to the vehicle via the first data interface 142.

The aggregation also contains a control function. By way of example, the control function comprises a check on the connection status of all the TESs 110 on the external data bus 132. Alternatively or additionally, the control function comprises a plausibility check on the signals obtained from the slave TES controllers 130-S. The plausibility check compares the signal obtained with limit values (e.g. current limits) for the respective TES 110-S that are stored for the signal type in the system controller 140.

If the signal obtained is erroneous, implausible or not on hand, the system controller 140 carries out an error reaction.

If the data 402 determine electrotechnical quantities (for example an instantaneous current, a maximum drawable current, an instantaneous voltage or a residual charge), the system controller 140 takes the interconnection of the TES high-voltage interfaces 114 as a basis for computing the aggregated electrotechnical quantity and outputs the latter as the system signal. The interconnection of the TES high-voltage interfaces 114 that is used is stored in the system controller 140 in the course of configuration of the master TES 110-S. By way of example, the system controller 140 stores aggregation rules on the basis of the interconnection. The aggregation rules may be defined both for electrotechnical characteristic quantities (for example internal resistance, open-circuit voltage, state of charge and/or state of health) and for limit values.

The signals 402 from the single TESs 110 that indicate a measured temperature are aggregated by detecting an extreme value among the signalled temperature values. By way of example, among all the signalled temperature values that are higher than 0° C., the highest temperature value is output in the system signal 404. Alternatively or additionally, among all the signalled temperature values that are lower than or equal to 0° C., the lowest temperature value is output in the system signal 404.

Preferably, the single TESs 110 are kept in an operating temperature range by shared coolant circulation. Among the temperature values of the coolant that are signalled by the single TESs 110, the highest temperature value is output as the system signal.

The signals 402 obtained from the single TESs 110 optionally indicate a charge (e.g. in coulombs, for example a residual charge remaining). The sum of the signalled charges is output in the system signal 404.

By way of example, the signals 402 indicate for each available TES 110 a minimum current and/or maximum current as limit values of the TES 110. A TES 110 is available if there is no error message from it and an error has not been detected by the system controller 140.

As a result, it is possible to ensure that every single TES 110 is operated within the operating limits continually checked for its intrinsic safety. Further, the exclusion of erroneous TESs 110 means that the vehicle can be operated with only some of the TESs 110 on account of the parallel interconnection of the TES high-voltage interfaces 114. This allows redundant operation (e.g. in the event of an excess capacity on TES 110) or emergency operation (e.g. what is known as a "limp home mode") to be realized.

Faulty TESs 110 are disconnected from the power system 160 by means of the respective contactor 170 or the respective contactors 170. Every single TES 110 implements its intrinsic safety. As a result, the system controller 140 can have no safety relevance.

Optionally, the signals 402 from the single TESs 110 indicate an energy content of the respective TES 110. The system signal 404 indicates a drawable total energy content. The system signal 404 can be based on an (optionally weighted) sum of the single energy contents. The contribution of the single energy contents of each TES 110 to the drawable total energy content can be determined from a proportional battery current.

On the basis of an internal resistance—signalled by each TES 110—of the respective TES 110, the total resistance of the TES system 100 can be computed in accordance with the interconnection of the TES high-voltage interfaces 114 and can be output as a system signal 404. Alternatively or additionally, the system controller 140 takes the signalled internal resistance values as a basis for determining the proportional battery current.

Optionally, the system controller 140 obtains signals 402 having life-optimized limit values (for an upper limit and a lower limit) of the state of charge from each TES 110. To aggregate the life-optimized limit values of the state of charge, the system controller 140 selects the life-optimum limit values of the state of charge that lead back to a target ageing curve with the resultant current distribution of all the TESs 110 in as optimum a fashion as possible. In this case, the resultant current distribution of the single TESs 110 is computed from the internal resistance values of the system controller 140 that are signalled by the single TESs 110.

The single TESs 110 can further indicate a state of health (also referred to as SoH) of the respective TES 110. The state of health of the single TESs 110 is used by the system controller 140 as a fault indicator for the respective TES 110 (e.g. when limit values are exceeded) and/or to compute a life-optimized limit value for the current of the respective TES 110 or of the TES system 100.

Alternatively or additionally, the state of charge and/or the state of health can be computed according to the same aggregation rules, which are also implemented for the state aggregation of the single storage cells 122 inside the cell module controller 124.

The signals 402 from the single TESs 110 indicate a voltage value (for example a present and/or predicted voltage value) for the single TESs 110. The system signal 404 for the corresponding voltage value is computed by the system controller 140 in accordance with the interconnection of the TES high-voltage interfaces 114.

In general, a system state 404 of the TES system 100 can be determined by virtue of the safest or most conservative state being selected from the storage states 402 signalled as available by the TESs 110. Alternatively or additionally, the TES system 100 can be operated in accordance with the weakest-power TES 110. The safest state may be the state that is most reliable for the instantaneous operation of all the TESs 110. The most conservative state can maximize the life of all the TESs 110.

In the communication direction from the vehicle to the TESs 110, all the vehicle signals 406 that the master TES controller 110-M obtains from the vehicle are distributed to the respective slave scope of functions 134 of the single TES controllers 130. If need be, the vehicle signal is converted into a control signal 408 specific to every single TES controller 130 in the process.

The aggregation and distribution of the signals by the system controller 140 also relates to the diagnosis of the TES system 100 (e.g. diagnosis requests from the vehicle to the system controller 140 and diagnosis reports from the system controller 140 to the vehicle). Diagnosis reports from the single TES controllers 130 are collected by the system controller 140 and output in aggregated fashion to the vehicle via the first data interface 142. The aggregation can comprise the formation of a standard data record in a data packet of the system signal 404, for example. The data record lists diagnosis values for the single cell modules 120 without grouping into TESs 110.

Diagnosis queries (which are also referred to as diagnosis routines) from a vehicle are obtained on the first data interface 142 of the system controller 140 and forwarded to the existing scope of functions 134 of the single TES controllers 130.

In the operating state of the TES system 100, the system contactor 164 and the contactors 170 (for example implemented on the TES high-voltage interfaces 114) are closed. In the operating state, charging and discharge currents flow through the system high-voltage interface 162 to and from the TESs 110. In the operating state, the voltages on the TES high-voltage interfaces 114 are standard on account of the parallel connection of the TESs 110. However, the current flowing through the system high-voltage interface 162 is not distributed in equal parts to the TES high-voltage interfaces 114 of the single TESs 110, since the TESs 110 differ in terms of their electrical and/or electrochemical storage states.

The storage capacity of each TES 110 describes its storage capability as the charge drawable in the completely charged state (e.g. the time integral of the discharge current from the initial voltage to the final voltage). The state of charge of each TES 110 is the proportion of the storage capacity that is charged that can still be drawn. The functional relationship between the (e.g. relaxed) open-circuit voltage on the TES high-voltage interface 114 and the state of charge of the TES 110 is the discharge curve. The electrical storage state of each TES 110 further includes the open-circuit voltage, its internal resistance, a first time constant (for example caused by an electrochemical double layer between electrode and electrolyte) and/or a second time constant (for example caused by diffusion of the ions in the electrolyte). The first time constant may be a fraction of a second, for example less than 0.1 s or 0.01 s. The second time constant may be greater than the first time constant, for example greater than 1 s or 10 s.

A discharge curve stored in the TES controller 130 can be used to determine the instantaneous state of charge on the basis of the measured open-circuit voltage. The discharge curve can be tabulated and/or updated by integration of the current in the operating state.

The single TESs 110 in the TES system 100 differ in their storage states, for example in respect of storage capacity, discharge curve, state of charge, open-circuit voltage, internal resistance, first time constant and/or second time constant. The cause and local influencing factors of the differing storage states of the single TESs 110 are manufacturing tolerance, ageing and temperature, for example.

Figure 5:
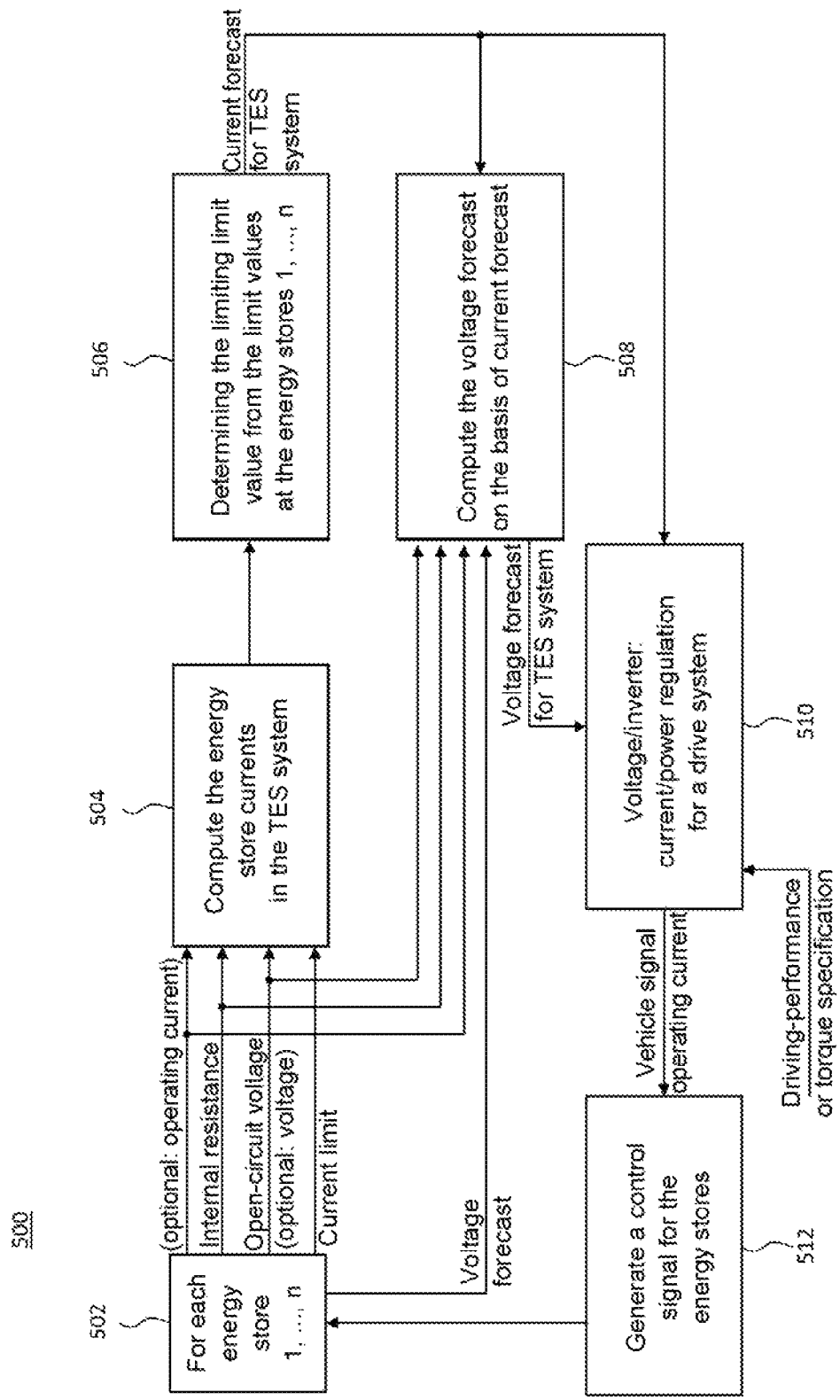
FIG. 5 shows a flowchart for a method of determining operating limits of the traction energy storage system for a vehicle.

FIG. 5 shows a flowchart for an exemplary implementation of a method 500 for determining operating limits. The operating limits can comprise a system limit value for the sum of the currents in a TES system 100 (according to any exemplary embodiment above).

In a step 502 of the method 500, the system controller 140 reads in the signals from the TES controllers 130 (for example from the slave scope of functions 134) of all the TESs 110. In one exemplary embodiment, an internal resistance $R_j$ and an open-circuit voltage $OCV_j$ as characteristic quantities and also at least one current limit (for example an upper current limit $I_j^{max}$) as a limit value are signalled for each TES 110 from the respective TES controller 130 to the system controller 140, for example via the second data interfaces 144, as the signals 402.

The signals 402 can comprise the respective characteristic quantities for the charging of the respective TES 110 and for the discharge of the respective TES 110. Alternatively or additionally, the system controller 140 obtains from the TES controllers 130 the respective limit values for the charging and discharge of the respective TES 110.

The at least one limit value may be based on a forecast period and/or may be explicitly time dependent. By way of example, the limit values can comprise an upper current limit $I_j^{max}(t)$, optionally differentiated for charging and discharge, of the TES 110 with the index j for the time t or the forecast period with the initial time t. Alternatively or additionally, the limit values comprise a corresponding lower current limit $I_j^{min}(t)$ and/or forecast limit values for the voltage of the respective TES 110.

In a step 504 of the method 500, the system controller 140 computes the currents $I_j$ of the TESs 110 with the index j=1, . . . , n in the TES system 100. Preferably, the currents $I_j$ are computed as the function $I_j(U)$ of the system voltage 206 denoted by the symbol U. In this case, the internal resistance $R_j$ and the open-circuit voltage $OCV_j$ are parameters of the function $I_j(U)$. Alternatively or additionally, for example on the basis of the function $I_j(U)$, the currents $I_j$ are computed as the function $I_j(I)$ of the system current 204 denoted by the symbol I.

Alternatively or additionally, the characteristic quantities obtained in step 502 comprise a present operating current $I_j$ and a present terminal voltage U of the j-th TES 110. Based on the operating current $I_j$ and the terminal voltage U, the system controller 140 computes the currents $I_j$ in conjunction with the respective internal resistance $R_j$ in step 504. By way of example, to this end, the present operating current $I_j$ and the present terminal voltage U are taken as a basis for computing the open-circuit voltage $OCV_j$ of the respective TES 110 using the internal resistance $R_j$.

By way of example, in step 504, the respective proportional current $I_j$ of the j-th TES 110 is computed in accordance with $$I_j=(OCV_j-U)/R_j \text{ for } j=1, \ldots, n \quad (1),$$

where U is the system voltage 206, $R_j$ is the internal resistance and $OCV_j$ is the open-circuit voltage of the j-th TES 110.

System limit values that are time dependent and/or are referenced to a future forecast period are also referred to as a forecast (for example current forecast or voltage forecast).

In a step 506 of the method 500, at least an upper system limit value, $I_{max}$, for the system current 204 of the TES system 100 and optionally a lower system limit value, $I_{min}$, for the system current 204 of the TES system 100 are determined by the system high-voltage interface 162 thereof.

The system limit value(s) of the system current is or are determined from the parallel connection of the TESs 110 (or the TES high-voltage interfaces 114 thereof). For the upper system limit value of the system current 204, the contribution $I_j$ of each TES 110 to the system current I cannot be greater, or cannot ever become greater within the forecast period, than the upper current limit $I_j^{max}$ of the respective TES 110 (or than the lowest current limit in the case of multiple upper current limits for the j-th TES 110).

Preferably, the upper system limit value $I_{max}$ for the system current 204 is computed from the n in equations $$I_j \leq I_j^{max}, \text{ for } j=1, \ldots, n, \quad (2)$$

where the system current 204 is the sum of the currents $$I=\Sigma_{j=1 \ldots n} I_j.$$

The lower system limit value $I_{min}$ for the system current 204 of the TES system 100 can be determined from the condition that, during the discharging mode of operation (I>0) of the TES system 100, none of the TESs 110 obtains a charging current ($I_j>0$ for all j), or from an obtained limit value, $I_j^{charging}$, for the charging of the respective TES 110 ($I_j > -I_j^{charging}$ for all j). Conversely, in the charging mode of operation of the TES system 100, the lower limit value, $I_{min}$, for the system current 204 of the TES system 100 can be determined from the condition that none of the TESs 110 is discharged, or from a limit value, $I_j^{discharge}$ for the discharge.

All of the system limit values can each be determined on a time-dependent basis and/or in a manner differentiated for charging and discharge.

The upper system limit value $I_{max}$, and possibly the lower system limit value $I_{min}$, is output as system signal 404 by the system controller 140 via the interface 202 for the function network 150 of the vehicle, for example to regulate the power of the drive of the vehicle.

The upper system limit value $I_{max}$, and possibly the lower system limit value $I_{min}$, for the system current 204 of the TES system 100 is also output to determine one or more system limit values for the system voltage 206 of the TES system 100.

A voltage forecast is determined in step 508 of the method 500. By way of example, analogously to the operation in step 506, one or more system limit values for the system voltage 206 of the TES system 100 is determined on the system high-voltage interface 162 on a time-dependent basis and in each case for the charging and discharge of the TES system 100. These system limit values for the system voltage 206 are determined from the system limit value—in each case determined at the time t and the mode of operation (charging or discharge)—of the system current 204 in conjunction with the characteristic quantities of the TESs 110 and forecast limit values for the voltage of the TESs 110 (voltage forecasts of the TESs 110).

The computation of the system limit values for the system current 204 in step 506 and for the system voltage 206 in step 508 also takes into consideration equalization currents, $I_{int}$, inside the TES system 100.

In a step 510, a vehicle signal 406 is generated on the basis of a vehicle-end specification of the driving performance or of the drive torque (for example by means of the accelerator pedal and/or a driver assistance system) taking into consideration the system limit values for the system current 204 and the system voltage 206, and is output to the system controller 140. The vehicle signal 406 prescribes the required operating current of the vehicle, i.e. is a reference variable for the system current 204 of the TES system 100.

In a step 512, the system controller 140 generates a specific control signal 408 on the basis of the vehicle signal 406 for each TES 110 that is part of the parallel connection. The control signal 408 can indicate the operating current $I_j$ of the respective TES 110. The operating current $I_j$ can be computed using the function $I_j(I)$ with the current I prescribed by the vehicle signal 406.

The generation of the signals 402 for step 502 may be implemented in the respective TES 110, for example the respective TES controller 130. At least steps 504 to 508 and 512 may be implemented in the system controller 140. Step 510 may be implemented at the vehicle end.

Figure 6:
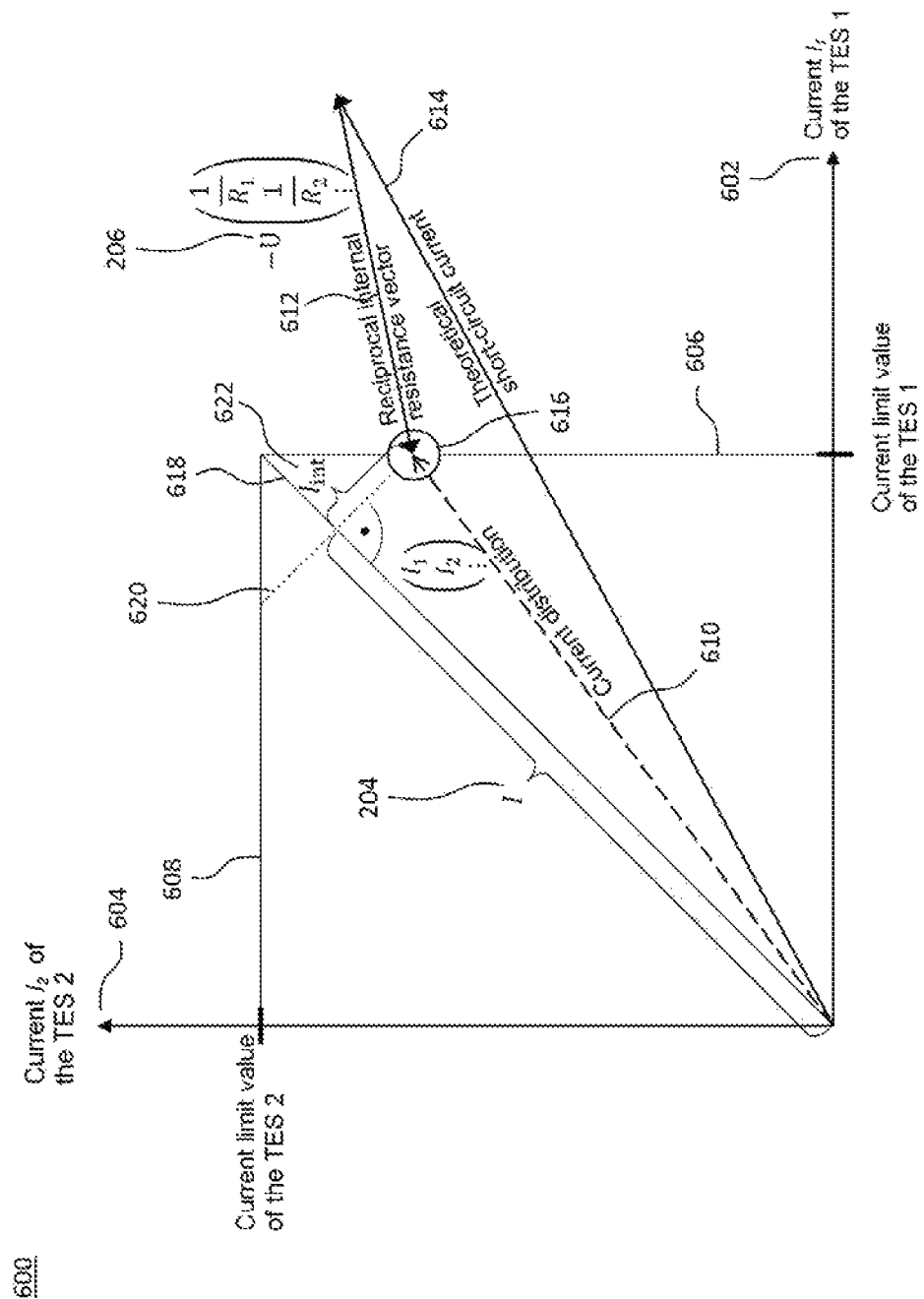
FIG. 6 shows a first aspect of an implementation of the method of FIG. 5.

FIG. 6 schematically shows a graph 600 of the currents of the TES system 100. For the sake of clarity, FIG. 6 shows only the partial currents 602 and 604 of two exemplary TESs 110 with the symbols $I_j$ for j=1 and j=2. In general, a vector space for the currents in the TES system 100 is generated by n orthogonal axes on which the currents $I_j$ of the TESs 110 with the index j=1, . . . , n are plotted.

The system controller 140 obtains a limit value 606 or 608 for the respective partial current 602 or 604 from each TES 110 in step 502.

The current distribution 610 computed in step 504 is a vector in the graph 600 with components $I_j$ for j=1, . . . , n, in accordance with the equation system (1). The current distribution 610 is composed of a current component 612 that is equal to the reciprocal internal resistance vector $1/R_j$ scaled with the system voltage 206 of the TES system, U, $-U/R_j$ for $j=1, \ldots, n,$ and a (theoretical) short-circuit current 614, $OCV_j/R_j$ for $j=1, \ldots, n,$ which would flow if the j-th TES 110 were shorted.

Condition (2) is met by virtue of the voltage drop U on the vehicle (for example of the DC voltage input of the inverter) being so large that the state 616 of the current distribution 610 is at the edge of or inside the rectangle (generally: n-dimensional rectangle) determined by the limit values 606 and 608.

The state 616 shown in FIG. 6 is on the edge of the admissible area that is determined by the limit value 606 of the first TES 110. That is to say that the limit value $I_j^{max}$ for j=1 is the limiting limit value that determines the upper system limit value for the system current 204 in step 506.

The state 616 shown in FIG. 6 corresponds to a minimum system voltage U, i.e. the lowest admissible system voltage 206 for the characteristic quantities 612 and 614 obtained.

Up to a factor (namely the square root of the number, n, of parallel-connected TESs 110), the system current 204 is equal to the projection of the vector, $(I_j)_{j=1 \ldots n}$, of the current distribution 610 onto the angle bisector 618 (which does not necessarily have to be the diagonal of the rectangle of the limit values 606, 608). That proportion of the vector of the current distribution 610 in the plane 620 that is perpendicular to the angle bisector 618 corresponds to the equalization currents 622 inside the TES system 100.

Figure 7:
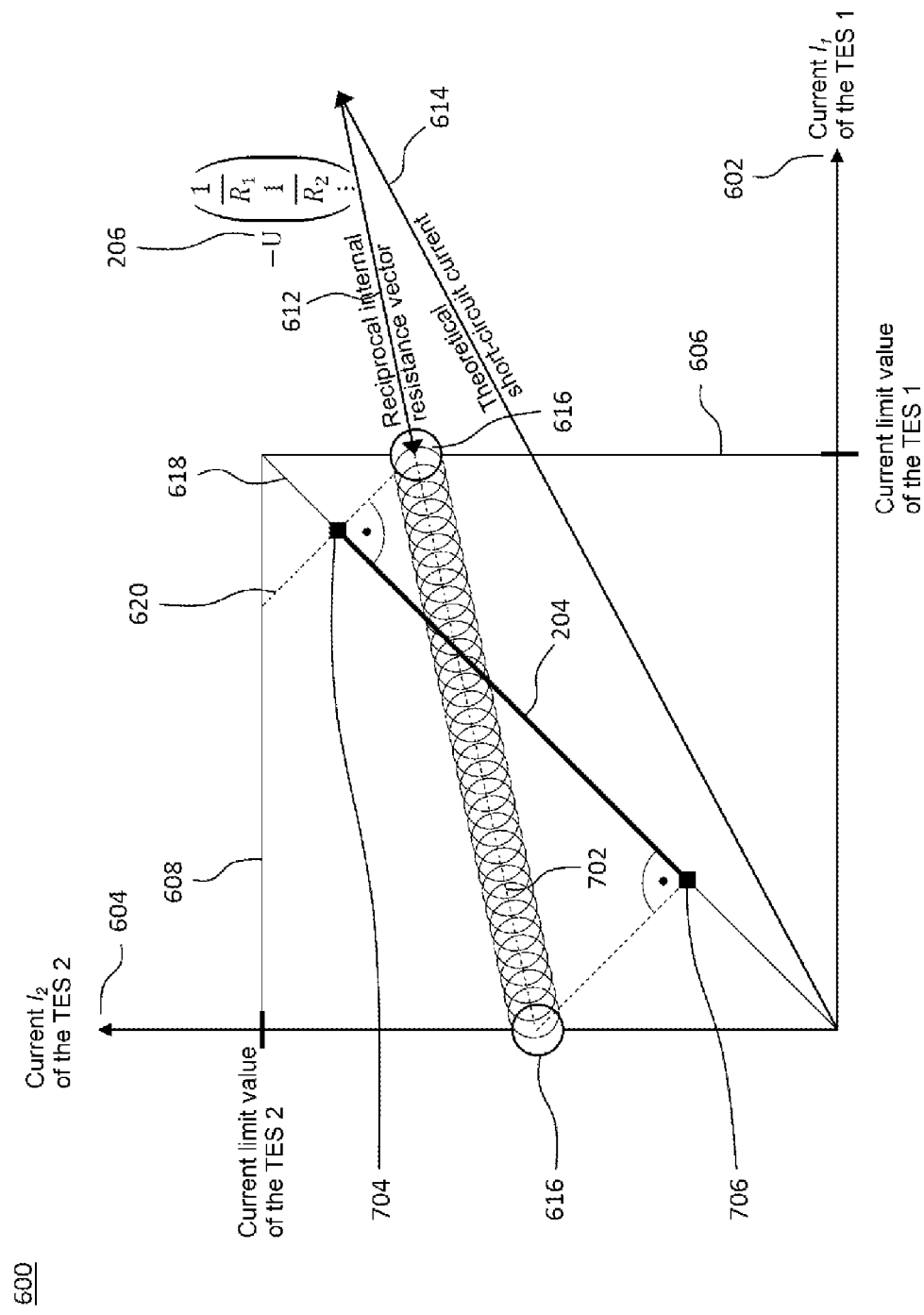
FIG. 7 shows a second aspect of an implementation of the method of FIG. 5.

FIG. 7 uses the graph 600 to schematically show the admissible states 616 that are possible for the obtained characteristic quantities 612 and 614 on a line 702. Larger system voltages 206 than for the state 616 shown in FIG. 6 correspond to smaller system currents 204 with a current distribution vector 610, the end of which (i.e. state 616) is inside the rectangle defined by condition (2) on the line 702 in an extension of the reciprocal internal resistance vector 612.

The upper system limit value, $I_{max}$, for the system current 204 is depicted by the reference symbol 704 in FIG. 7. The lower limit values, $I_j^{min}$, for the current of the j-th TES 110 (which are depicted by way of example for $I_j^{min}=0$ in FIG. 7) determine the lower system limit value, $I_{min}$, for the system current 204, which lower system limit value is shown by the reference symbol 706. In the example shown in FIG. 7, the lower limit value $I_1^{min}$ is limiting. The state 616 (which is at the left-hand edge in the graph 600 in FIG. 7) of the smallest system current 204 corresponds to the largest admissible system voltage 206.

Although the present disclosure has been described referring to exemplary embodiments by way of example, it is evident to a person skilled in the art that various changes can be made and equivalents can be used as a substitute. Further, many modifications can be made in order to adapt a particular situation or a particular piece of material to the teaching of the present disclosure. Consequently, the present disclosure is not restricted to the exemplary embodiments disclosed, but rather comprises all exemplary embodiments that fall within the scope of the appended patent claims.

LIST OF REFERENCE SYMBOLS

100 Traction energy storage system
110 Energy store
112 Housing of the energy store
114 High-voltage interface
120 Cell module
122 Storage cells
124 Cell module controller
126 Internal data bus
127 Connection terminal
128 Busbar
130 TES controller
132 External data bus
134 Scope of functions of the TES controller in standalone operation
140 System controller
142 First data interface
144 Second data interface
150 Function network of the vehicle
160 Power system of the vehicle
162 System high-voltage interface
164 System contactor
170 Contactor
172 Control connection between TES controller and contactor
202 CAN bus of the function network
204 System current
206 System voltage
401 Storage cell data
402 Signal from the energy store
404 System signal
406 Vehicle signal
408 Control signal
500 Method for determining operating limits
502 Step of obtaining characteristic quantities
504 Step of determining energy store currents
506 Step of determining current limit values
508 Step of determining voltage limit values
510 Step of obtaining a vehicle signal
512 Step of generating a control signal
600 Graph of the currents
602 Partial current of a first energy store
604 Partial current of a second energy store
606 Limit value for partial current of the first energy store
608 Limit value for partial current of the second energy store
610 Vector of the current distribution
612 Current component from reciprocal internal resistance vector
614 Short-circuit current 616 State of the current distribution
618 Angle bisector in the graph of currents
620 Plane of the equalization currents
622 Equalization currents
702 Line for the admissible and possible states
704 Upper system limit value for the system current
706 Lower system limit value for the system current

I claim:

1. A traction energy storage system for a vehicle, comprising:
multiple electrical energy stores, wherein each of the energy stores comprises one or more cell modules electrically connected via busbars, an energy store high-voltage interface connected or connectable to the busbars and an energy store controller controlling the cell modules, and each of the cell modules includes multiple storage cells and a cell module controller and wherein each of the cell module controllers is configured to output measured values relating to the storage cells in the respective cell module to the energy store controller, and each of the energy store controllers is configured to take the measured values obtained as a basis for generating signals having electrical characteristic quantities of the respective energy store and at least one limit value for a current through the energy store high-voltage interface of the respective energy store; and
a system controller that is configured to obtain the signals from the energy store controller to take the characteristic quantities of all the energy stores as a basis for computing the current through each of the energy store high-voltage interfaces when the energy store high-voltage interfaces are connected in parallel, and to take the computed currents and the limit values for the currents as a basis for determining a system limit value for the sum of the currents and to output said system limit value as a system signal.

2. The traction energy storage system according to claim 1, wherein the currents are computed by the parallel-connected energy store high-voltage interfaces as a function of the sum of the currents.

3. The traction energy storage system according to claim 2, wherein the system controller is further configured to determine the system limit value for the sum of the currents by maximizing the sum of the currents while observing the limit values of all the energy stores.

4. The traction energy storage system according to claim 2, wherein the system controller is further configured to determine the system limit value for the sum of the currents by determining a limiting limit value among the limit values of all the energy stores that limits the function of the sum of the currents.

5. The traction energy storage system according to claim 1, wherein the system controller is further configured to take the computed currents and the limit values for the currents as a basis for determining a system limit value for the voltage of the parallel-connected energy store high-voltage interfaces and to output said system limit value as a system signal.

6. The traction energy storage system according to claim 5, wherein the system controller is configured to determine a system limit value for the voltage on the basis of the system limit value for the sum of the currents.

7. The traction energy storage system according to claim 5, wherein the currents are computed by the parallel-connected energy store high-voltage interfaces as a function of the voltage of the parallel-connected energy store high-voltage interfaces, and wherein the system controller is configured to determine the system limit value for the voltage by maximizing the voltage of the parallel-connected energy store high-voltage interfaces while observing the limit values of all the energy stores.

8. The traction energy storage system according to claim 1, wherein the energy stores generate the respective limit values for charging and for discharge of the energy store and wherein the system controller determines and outputs the respective system limit value for the charging and for the discharge of the traction energy storage system.

9. The traction energy storage system according to claim 1, wherein the characteristic quantities or the limit values of the energy stores are a function of a forecast period, and wherein the system limit value is determined and output as a function of the forecast period.

10. The traction energy storage system according to claim 9, wherein the limit values of the energy stores and/or the computation of the system controller are based on continual, optionally constant, currents in the forecast period.

11. The traction energy storage system according to claim 1, wherein the characteristic quantities of the respective energy store indicate an open-circuit voltage and an internal resistance of the respective energy store, or the characteristic quantities are dependent on the open-circuit voltage and the internal resistance of the respective energy store.

12. The traction energy storage system according to claim 1, wherein the system controller is further configured to obtain a vehicle signal, to analyse said vehicle signal and to take the analysis as a basis for outputting a control signal to at least one of the energy store controllers.

13. The traction energy storage system according to claim 1, wherein one of the energy store controllers carries out the function of the system controller.

14. The traction energy storage system according to claim 1, wherein the function of the system controller is implemented in each of the energy store controllers and, in one of the energy store controllers, is activated to be carried out.

15. The traction energy storage system according to claim 13, wherein each of the energy stores further comprises a first data interface and a second data interface, each of which is connected in the energy store to the energy store controller,
wherein in the case of the energy stores that do not carry out the function of the system controller, the first data interface is unconnected outside the energy store, and the second data interface is connected to output the signal to the second data interface of the energy store that carries out the function of the system controller; and
wherein in the case of the energy store that carries out the function of the system controller the first data interface is connected to the vehicle outside the energy store to output the system signal and the second data interface is connected to obtain the signals from the second data interfaces of the energy stores that do not carry out the function of the system controller.

16. The traction energy storage system according to claim 1, wherein the motor vehicle is a commercial vehicle.

* * * * *